US009754783B2

(12) United States Patent
Takashima et al.

(10) Patent No.: US 9,754,783 B2
(45) Date of Patent: Sep. 5, 2017

(54) METHOD FOR PRODUCING A SEMICONDUCTOR DEVICE, AND SEMICONDUCTOR DEVICE

(71) Applicant: FUJI ELECTRIC CO., LTD., Kawasaki-shi (JP)

(72) Inventors: Shinya Takashima, Hachioji (JP); Ryo Tanaka, Santa Barbara, CA (US); Katsunori Ueno, Matsumoto (JP); Masaharu Edo, Saitama (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/848,214

(22) Filed: Sep. 8, 2015

(65) Prior Publication Data
US 2015/0380238 A1 Dec. 31, 2015

Related U.S. Application Data

(63) Continuation of application No. PCT/JP2014/067276, filed on Jun. 27, 2014.

(30) Foreign Application Priority Data

Jul. 31, 2013 (JP) .................. 2013-159578

(51) Int. Cl.
*H01L 21/02* (2006.01)
*H01L 21/18* (2006.01)
(Continued)

(52) U.S. Cl.
CPC ........ *H01L 21/0254* (2013.01); *C23C 16/303* (2013.01); *C23C 16/56* (2013.01);
(Continued)

(58) Field of Classification Search
CPC ............ H01L 21/0254; H01L 21/3245; H01L 21/0262; H01L 29/66522; H01L 29/7827; H01L 29/2003
See application file for complete search history.

(56) References Cited

U.S. PATENT DOCUMENTS

| 5,306,662 A | 4/1994 | Nakamura et al. |
| 5,656,832 A | 8/1997 | Ohba et al. |

(Continued)

FOREIGN PATENT DOCUMENTS

| JP | H05-183189 A | 7/1993 |
| JP | H08-186332 A | 7/1996 |

(Continued)

OTHER PUBLICATIONS

Cao et al., "Ultrahihg Si+ implant implant activation efficiency in GaN using a high-temperature rapid thermal process system", Applied Physics Letters, 73 (1993): pp. 229-231.*

(Continued)

*Primary Examiner* — Michele Fan
(74) *Attorney, Agent, or Firm* — Rabin & Berdo, P.C.

(57) ABSTRACT

A method for producing a semiconductor device having a nitride-based semiconductor layer includes forming an aluminum nitride layer on a surface of the nitride-based semiconductor layer at a forming temperature and in a growth atmosphere for aluminum nitride; and performing a thermal treatment on the nitride-based semiconductor layer and the aluminum nitride layer, at a treatment temperature that is higher than the forming temperature and in the growth atmosphere for aluminum nitride. For example, an n-GaN layer is formed on an n-GaN substrate, and thereafter the n-GaN layer is doped with an impurity. A cap layer of an epitaxial film made up of AlN is formed, by MOCVD, on the surface of the n-GaN layer. Thermal treatment for activation annealing activates the impurity in the n-GaN layer in an (Continued)

atmosphere that causes AlN to grow, or in an atmosphere in which growth and decomposition of AlN are substantially balanced.

22 Claims, 6 Drawing Sheets

(51) Int. Cl.
    *H01L 21/22*     (2006.01)
    *C23C 16/56*     (2006.01)
    *H01L 29/20*     (2006.01)
    *C30B 23/02*     (2006.01)
    *C23C 16/30*     (2006.01)
    *H01L 29/66*     (2006.01)
    *H01L 29/78*     (2006.01)
    *H01L 21/324*     (2006.01)
    *C30B 25/02*     (2006.01)
    *C30B 29/40*     (2006.01)

(52) U.S. Cl.
    CPC .......... *C30B 23/02* (2013.01); *H01L 21/0262* (2013.01); *H01L 21/02609* (2013.01); *H01L 21/18* (2013.01); *H01L 21/22* (2013.01); *H01L 21/3245* (2013.01); *H01L 29/2003* (2013.01); *H01L 29/66522* (2013.01); *H01L 29/7827* (2013.01); *C30B 25/02* (2013.01); *C30B 29/406* (2013.01)

(56) References Cited

U.S. PATENT DOCUMENTS

| | | | | |
|---|---|---|---|---|
| 5,998,232 | A * | 12/1999 | Maruska | H01L 33/325 257/13 |
| 6,335,218 | B1 | 1/2002 | Ota et al. | |
| 6,432,788 | B1 * | 8/2002 | Maruska | H01L 29/66318 257/E21.387 |
| 2002/0096496 | A1 * | 7/2002 | Molnar | H01L 21/0279 216/87 |
| 2002/0167023 | A1 * | 11/2002 | Chavarkar | H01L 29/7783 257/194 |
| 2004/0245540 | A1 * | 12/2004 | Hata | B82Y 20/00 257/99 |
| 2010/0032644 | A1 * | 2/2010 | Akita | H01L 33/32 257/13 |
| 2010/0133656 | A1 | 6/2010 | Hager, IV et al. | |
| 2010/0147835 | A1 * | 6/2010 | Mulpuri | C23C 14/025 219/759 |
| 2011/0193096 | A1 * | 8/2011 | Imada | H01L 29/7788 257/76 |
| 2012/0068188 | A1 * | 3/2012 | Feigelson | H01L 21/324 257/76 |
| 2014/0054680 | A1 * | 2/2014 | Hashimoto | H01L 21/3242 257/329 |
| 2014/0175450 | A1 * | 6/2014 | Disney | H01L 29/0615 257/76 |
| 2014/0264379 | A1 * | 9/2014 | Kub | H01L 29/41725 257/77 |

FOREIGN PATENT DOCUMENTS

| | | |
|---|---|---|
| JP | 2540791 B2 | 10/1996 |
| JP | 2000-323751 A | 11/2000 |

OTHER PUBLICATIONS

J. C. Zolper et al., "Sputtered AlN encapsulant for high-temperature of GaN", Appl. Phys. Lett. 69(4), Jul. 22, 1996 pp. 538-540.

X. A. Cao et al., "Ultrahigh Si+ implant activation efficiency in GaN using a high-temperature rapid thermal process system", Applied Physics Letters, vol. 73, No. 2, Jul. 13, 1998, pp. 229-231.

K. A. Jones et al., "The Properties of Annealed AlN Films Deposited by Pulsed Laser Deposition", Journal of Electronic Materials, vol. 29, No. 3, 2000 pp. 262-267.

B.N. Feigelson et al., "Multicycle rapid thermal annealing technique and its application for the electrical activation of Mg implanted in GaN", Journal of Crystal Growth, vol. 350, No. 1, Jul. 1, 2012, pp. 21-26.

* cited by examiner

METHOD FOR PRODUCING A SEMICONDUCTOR DEVICE, AND SEMICONDUCTOR DEVICE

CROSS-REFERENCE TO RELATED APPLICATION(S)

This non-provisional Application for a U.S. Patent is a Continuation of International Application PCT/JP2014/067276 filed Jun. 27, 2014, which claims priority from JP PA 2013-159578 filed Jul. 31, 2013, the entire contents of both of which are hereby incorporated by reference.

BACKGROUND OF THE INVENTION

1. Field of the Invention

The present invention relates to a method for producing a semiconductor device including a thermal treatment step, and to a semiconductor device.

2. Background of the Related Art

The field of power semiconductor devices has witnessed, in recent years, active development and research of products, having already begun to be put into practical use, that utilize wide band gap semiconductors such as nitride-based semiconductors, for instance gallium nitride (GaN)-based semiconductors. As is known, wide band gap semiconductors are advantageous, as compared with conventionally used silicon (Si), in that the former allows producing high-breakdown voltage semiconductor devices with low on-resistance, and enable operation at high temperatures. By virtue of such advantages, nitride-based semiconductors are expected to replace Si-based materials, as materials of power devices such as inverters and converters.

A thermal treatment, i.e., activation annealing at a high temperature, for crystal recovery and/or impurity activation, has to be performed after ion implantation in the production process of a nitride-based semiconductor device that is produced using a nitride-based semiconductor. However, when the activation annealing of a nitride-based semiconductor such as a GaN-based semiconductor involves setting a heating temperature of 800° C. or higher, so-called nitrogen loss occurs in that nitrogen (N) in the composition escapes from the nitride-based semiconductor, and the latter starts decomposing.

Therefore, a method is resorted to that involves performing activation annealing after formation of a protective film (cap layer) comprising a material of high heat resistance, on the upper layer of a nitride-based semiconductor layer. Japanese Patent Application Publication No. H08-186332 (Patent Literature 1), Japanese Patent No. 2540791 (Patent literature 2), and J. C. Zolper et al., "Sputtered AlN encapsulant for high-temperature of GaN", Appl. Phys. Lett. 69(4), 22 Jul. 1996 pp. 538-540 (Non-patent literature 1) disclose methods that involve performing a thermal treatment in nitrogen while protecting the surface using an AlN layer as a protective film.

Activation annealing after impurity doping, for instance by ion implantation, requires heating at a temperature that is about ⅔ of the melting point of the material that makes up the semiconductor layer. Specifically, a heating temperature ranging from about 1500° C. to 1700° C. is envisaged in a case where a nitride-based semiconductor such as GaN is used as the semiconductor material.

With all that said, it has been reported, for instance, in X. A. Cao et al., "Ultrahigh Si+ implant activation efficiency in GaN using a high-temperature rapid thermal process system", APPLIED PHYSICS LETTERS 73 (1998) pp. 229-231, (Non-patent literature 2) and K. A. Jones et al., "The Properties of Annealed AlN Films Deposited by Pulsed Laser Deposition", Journal of ELECTRONIC MATERIALS, Vol. 29, No. 3 2000 pp. 262-267 (Non-patent literature 3), that even when using an AlN layer as a protective film, however, pits may occur in the AlN layer, or the latter may decompose, at such high-temperature regions, so that, as a result, the AlN layer no longer function as a protective film. For instance, Non-patent literature 2 reports the occurrence of pits in an AlN layer due to heating at a temperature of 1400° C. or higher, as an example where heating is performed at a temperature up to 1500° C. as a high-temperature region. When pits occur in the AlN layer that is used as a protective film during the thermal treatment, the likelihood increases of the occurrence of release of nitrogen, that makes up the underlying nitride-based semiconductor layer, through the pits.

Such being the case, the temperature of activation annealing in the related art has been limited to about 1300° C. In a case where activation annealing is performed after impurity doping, for instance by ion implantation or the like, it is impossible to elicit sufficient impurity activation and crystallinity recovery, in a semiconductor layer, at a heating temperature of about 1300° C. The problem of, for instance, lowered carrier mobility in the semiconductor device that is produced arises as a result in related art. A further problem is that, in particular in a case where a p-type region is formed by ion implantation, it has not been possible to obtain a sufficient p-type carrier concentration for the amount of implanted impurity, due to the n-type carrier compensating effect elicited by defects.

In view of the above, it is an object of the present invention to provide a method for producing a semiconductor device and a semiconductor device that allow a high-temperature thermal treatment to be carried out stably and effectively, while preventing nitrogen loss from a nitride-based semiconductor layer that makes up a semiconductor device.

SUMMARY OF THE INVENTION

In order to solve the above problems and attain the above goal, the method for producing a semiconductor device according to the present invention is a method for producing a semiconductor device having a nitride-based semiconductor layer, the method comprising: a formation step of forming an aluminum nitride layer on a surface of the nitride-based semiconductor layer at a forming temperature and in a growth atmosphere for aluminum nitride; and a thermal treatment step of, after the formation step, performing a thermal treatment on the nitride-based semiconductor layer and the aluminum nitride layer, at a treatment temperature that is higher than the forming temperature in the formation step and in the growth atmosphere of aluminum nitride.

The method for producing a semiconductor device according to the present invention is characterized in that in the above invention, the aluminum nitride layer is a polycrystalline structure film or a film formed by epitaxial growth.

The method for producing a semiconductor device according to the present invention is characterized in that in the above invention, the growth atmosphere of aluminum nitride in the thermal treatment step is an atmosphere that causes aluminum nitride to grow, or an atmosphere in which growth and decomposition of aluminum nitride are substantially balanced.

The method for producing a semiconductor device according to the present invention is characterized in that in the above invention, the growth atmosphere of aluminum nitride in the thermal treatment step is a metal-organic chemical vapor deposition atmosphere made up of a mixed gas atmosphere of an organometallic gas containing aluminum, and a gas that contains hydrogen and nitrogen. The method for producing a semiconductor device according to the present invention is characterized in that in the above configuration, the organometallic gas is trimethyl aluminum gas, and the gas containing hydrogen and nitrogen contains a mixed gas of ammonia gas and a gas that contains at least one of hydrogen gas and nitrogen gas.

The method for producing a semiconductor device according to the present invention is characterized in that in the above invention, the growth atmosphere of aluminum nitride in the thermal treatment step is a vapor phase growth atmosphere made up of a mixed gas atmosphere of a chloride gas containing aluminum, and a gas containing hydrogen and nitrogen.

The method for producing a semiconductor device according to the present invention is characterized in that in the above invention, the growth atmosphere of aluminum nitride in the thermal treatment step is a solution growth atmosphere that comprises a melt containing aluminum, and a nitrogen-containing gas.

The method for producing a semiconductor device according to the present invention is characterized in that in the above invention, the growth atmosphere of aluminum nitride in the thermal treatment step is a sublimation atmosphere that causes a powder of aluminum nitride to sublimate.

The method for producing a semiconductor device according to the present invention is characterized in that the above invention further comprises a step of, before the thermal treatment step, doping the nitride-based semiconductor layer with an impurity.

The method for producing a semiconductor device according to the present invention is characterized in that in the above invention, the nitride-based semiconductor layer comprises gallium nitride.

The semiconductor device according to the present invention is characterized by being produced in accordance with the method for producing a semiconductor device according to the above invention.

Effect of the Invention

The method for producing a semiconductor device and semiconductor device according to the present invention allow performing, stably and effectively, a thermal treatment at a high temperature, while preventing nitrogen loss from a nitride-based semiconductor layer.

DETAILED DESCRIPTION OF THE INVENTION

Embodiments of the present invention will be explained next with reference to accompanying drawings. This invention is however not limited to or by the embodiments. In the figures, identical or corresponding elements are denoted, as appropriate, by identical reference symbols. The figures are schematic, and it should thus be noted that relationships and so forth between the dimensions of the various elements may differ from those of actual elements. The figures may also include portions of mutually different dimensional relationships or ratios between the figures.

Embodiment 1: Semiconductor Device

Figure 1:
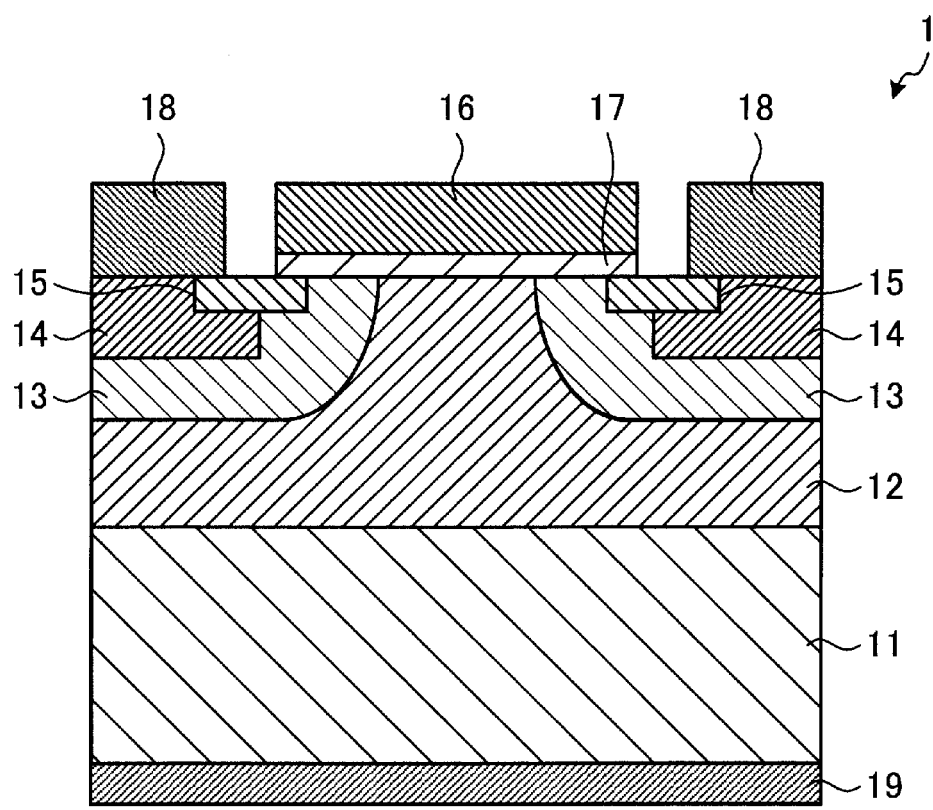
FIG. 1 is a cross-sectional diagram illustrating a semiconductor device according to Embodiment 1 of the present invention.

A semiconductor device according to Embodiment 1 of the present invention will be explained first. FIG. 1 is a cross-sectional diagram illustrating the configuration of a vertical-type MOSFET, as a semiconductor device of Embodiment 1. As illustrated in FIG. 1, the semiconductor device 1 according to Embodiment 1 comprises an n-type gallium nitride (n-GaN) substrate 11 with an n-type impurity, and an n-GaN layer 12, formed for instance by epitaxial growth on the n-GaN substrate 11, and having a lower impurity concentration than that of the n-GaN substrate 11.

Figure 2:
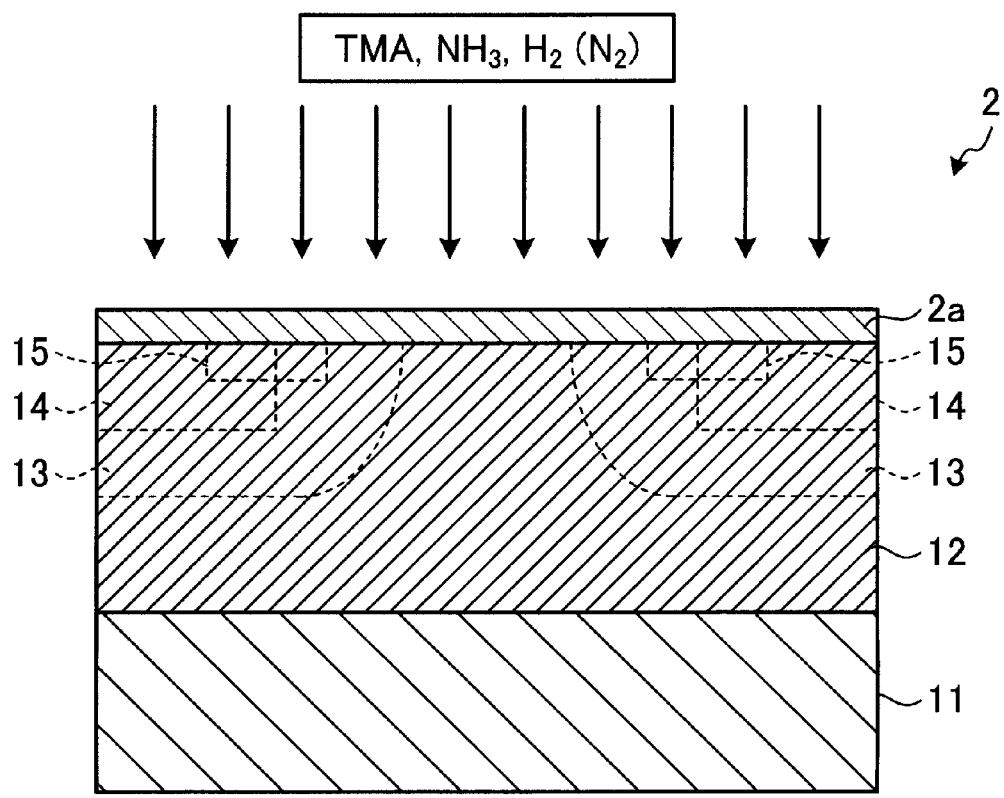
FIG. 2 is a schematic diagram for explaining a method for producing a semiconductor device according to Embodiment 1 of the present invention.

In the n-GaN layer 12 there are formed a p-type well region 13 selectively doped with a p-type impurity, a $p^+$-type well region 14 selectively doped with a p-type impurity, to a higher concentration than that in the p-type well region 13, and an $n^+$-type source region 15 selectively doped with an n-type impurity, at a portion between the p-type well region 13 and the $p^+$-type well region 14. A gate electrode 16 is provided between a pair of p-type well regions 13, at a portion on the surface of the n-GaN layer 12. The gate electrode 16 is provided, on the surface of the n-GaN layer 12, via a gate insulating film 17 made up of an insulator such as silicon oxide ($SiO_2$), at the bottom face of the gate electrode 16. A pair of source electrodes 18 is provided, on the n-GaN layer 12, so as to flank the gate electrode 16 and the gate insulating film 17 while spaced therefrom. A drain electrode 19 is provided on the rear surface of the n-GaN substrate 11. By virtue of the above configuration, a channel is formed in the semiconductor device 1, during driving of the latter, from the upper-layer p-type well region 13 over to the n-GaN substrate 11. Method for producing a semiconductor device A method for producing the semiconductor device 1 according to Embodiment 1 having the above configuration will be explained next. FIG. 2 is a schematic diagram for explaining a method for producing the semiconductor device 1 according to Embodiment 1.

Firstly, GaN is grown, for instance by metal-organic chemical vapor deposition (MOCVD), on the n-GaN substrate 11 illustrated in FIG. 1, while doping the GaN being grown with an n-type impurity, to form thereby the n-GaN layer 12 as a nitride-based semiconductor layer. A sapphire substrate, a SiC substrate, a $ZrB_2$ substrate or the like may be used instead of the n-GaN substrate 11. The n-GaN layer 12 may be grown by hydride vapor phase epitaxy (HVPE) or molecular beam epitaxy (MBE), instead of MOCVD.

Next, the n-GaN layer 12 is sequentially doped with a p-type impurity, in accordance with, for instance, an ion implantation method, at a region where the p-type well region 13 and the $p^+$-type well region 14 are to be formed. Similarly, an n-type impurity is selectively doped, for instance by ion implantation method, into a region of the portion of the p-type well region 13 and the $p^+$-type well region 14 at which the $n^+$-type source region 15 is to be formed.

Next, as illustrated in FIG. 2, a cap layer 2a is formed on the surface of the n-GaN layer 12. Materials that are suitable for a subsequent thermal treatment step are selected herein as the material of the cap layer 2a that protects the surface of the n-GaN layer 12. Specifically, the material of the cap layer 2a is preferably a material having higher heat resistance than that of the underlying n-GaN layer 12, and having good adhesion with the n-GaN layer 12, such that the cap layer 2a does not peel during a thermal treatment; moreover, the material does not react readily with the n-GaN layer 12, and impurities do not diffuse readily into the material.

Therefore, aluminum nitride (AlN) is used as the material that makes up the cap layer 2a in Embodiment 1. The AlN that constitutes the cap layer 2a makes for increased etching selectivity relative to GaN, and is accordingly a preferred material in terms of facilitating selective removal of the cap layer 2a after the thermal treatment.

In Embodiment 1, for instance, the cap layer 2a as a protective film and comprising AlN is formed, on the surface of the n-GaN layer 12, by MOCVD in which a mixed gas is used that comprises trimethyl aluminum (TMA; $Al(CH_3)_3$)) gas, ammonia ($NH_3$) gas, and at least one gas from among hydrogen ($H_2$) gas and nitrogen ($N_2$) gas. The heating temperature during formation of the cap layer 2a is preferably a temperature lower than the thermal treatment temperature (heating temperature) in the activation annealing that is performed thereafter, and ranges specifically, for instance, from 800° C. to 1200° C., while the atmosphere pressure ranges for instance from 5 kPa to 20 kPa.

In terms of making the cap layer 2a a dense layer so as to obtain a more pronounced surface protective effect, the cap layer 2a is preferably formed by epitaxial growth, for instance by MOCVD, HVPE, MBE or the like, but can also be formed by sputtering. The cap layer 2a can also be configured in the form of an AlN layer having a polycrystalline structure, other than an AlN layer comprising a so-called epitaxial growth film grown by MOCVD or the like. A substrate to be processed 2 is thus obtained as a result.

Next, the substrate to be processed 2 is placed for instance in a reactor tube (not shown), using a mixed gas atmosphere i.e. a so-called metal-organic chemical vapor deposition (MOCVD) atmosphere of a gas that comprises TMA gas, $NH_3$ gas and at least one from among $H_2$ gas and $N_2$ gas, as a growth atmosphere of the AlN that makes up the cap layer 2a, as illustrated in FIG. 2. In this AlN growth atmosphere there is performed a thermal treatment step of heating the substrate to be processed 2, specifically, activation annealing is performed as a high-temperature thermal treatment for activating impurities comprised in the substrate to be processed 2. Activation annealing is a high-temperature thermal treatment in which the heating temperature is for instance 800° C. or higher, preferably 1200° C. or higher, and yet more preferably 1500° C. or higher. The atmosphere pressure within the reactor tube (not shown) of the MOCVD apparatus in which the substrate to be processed 2 is placed ranges from 5 kPa to 10 kPa.

Activation annealing in this production method is performed in the AlN growth atmosphere. The AlN growth atmosphere in activation annealing is an atmosphere that elicits growth of AlN. As a result, even if the AlN that makes up the cap layer 2a undergoes a decomposition reaction at the temperature at which activation annealing is performed, a growth reaction of AlN by the AlN growth atmosphere proceeds at the same time. As a result, decomposition of the AlN that makes up the cap layer 2a is suppressed, and formation of pits in the cap layer 2a is thus prevented. The AlN growth atmosphere in activation annealing may be an atmosphere in which there is a substantial equilibrium between AlN decomposition and growth, such that the cap layer 2a does not decompose and no pits are formed during the thermal treatment step. The thickness of the AlN layer that makes up the cap layer 2a may increase or decrease during the thermal treatment step, and it suffices that the cap layer 2a be left standing once the thermal treatment step is over, without pits having been formed on the cap layer 2a during the thermal treatment step. The extent of growth and decomposition of AlN can be controlled by adjusting at least any one from among thermal treatment temperature, the atmosphere pressure, and the supply amounts of the TMA gas and the $NH_3$ gas, as starting gases.

As a result of the activation annealing above, the impurities in the n-GaN layer 12 are activated, and the p-type well region 13, the $p^+$-type well region 14 and the $n^+$-type source region 15 are accordingly formed.

Next, the cap layer 2a is removed from the substrate to be processed 2 by wet etching, using for instance an aqueous solution of potassium hydroxide (KOH) having high etching selectivity between GaN and AlN.

Next, the gate insulating film 17 comprising, for instance, a $SiO_2$ film, is deposited, for instance by PECVD (Plasma Enhanced CVD), on the entire top face of the n-GaN layer 12. The thickness of the gate insulating film 17 is for instance about 100 nm. Other than an $SiO_2$ film, the gate insulating film 17 may be an insulating film in the form of a $SiN_x$ film, a SiON film, an $Al_2O_3$ film, a MgO film, a $GaO_x$ film, a $GdO_x$ film or the like, or a stacked film comprising any one of the foregoing.

Next, a polycrystalline silicon film is formed, for instance by LPCVD (low pressure chemical vapor deposition), on the gate insulating film 17, with n-type impurity atoms, for instance of phosphorus (P) or arsenic (As), being doped after or during formation of the polycrystalline silicon film. The polycrystalline silicon film exhibits conductivity as a result. Doping of the polycrystalline silicon film with n-type impurity atoms can be accomplished by ion implantation of n-type impurity atoms after formation of the polycrystalline silicon, or through introduction of n-type impurity atoms into the growth atmosphere, during growth of the polycrystalline silicon. As a result of the thermal treatment, the doping n-type impurity atoms are activated and diffuse into the polycrystalline silicon film.

Next, the polycrystalline silicon film and the gate insulating film 17 are patterned according to a photolithographic process and an etching process, to expose thereby the surface of the n-GaN layer 12 at a region other than the formation region of the gate insulating film 17 and the gate electrode 16. The etching process may be accomplished for instance by RIE (Reactive Ion Etching) or ICP (Inductively Coupled Plasma)-RIE. Other than a polycrystalline silicon film doped with an n-type impurity atom, a metal film of gold (Au), platinum (Pt) of nickel (Ni), or an alloy film of the foregoing, may also be used as the gate electrode 16.

Next, the pair of source electrodes 18, which is to be in ohmic contact with the n$^+$-type source region 15 and the p$^+$-type well region 14 formed in the n-GaN layer 12, is selectively formed on the surface of the exposed n-GaN layer 12, at regions flanking the gate electrode 16 while spaced apart from the latter. For instance, a stacked metal film comprising Ti/Al resulting from sequentially stacking titanium (Ti) and aluminum (Al), can be used as the source electrodes 18. The configuration of the source electrodes 18 is not limited thereto, and various types of metallic material can be used herein, so long as the resulting conductor film has an ohmic junction, or a low-resistance junction close to that of an ohmic junction, with the n$^+$-type source region 15 and the p$^+$-type well region 14. The configuration of the source electrodes 18 may differ between the n$^+$-type source region and the p$^+$-type well region. A lift-off method or selective growth method can be used to form the source electrodes 18.

Next, the drain electrode 19, comprising a stacked metal film, for instance Ti/Al, is formed on the rear surface of the n-GaN substrate 11, on the side opposite that where the source electrodes 18 are formed on the n-GaN layer 12. Dicing is performed thereafter through element separation, as a result of which there is produced the semiconductor device 1 illustrated in FIG. 1.

In Embodiment 1 of the present invention explained above, the n-GaN layer 12 is doped with impurities, the cap layer 2a comprising an AlN layer is formed, as a protective film, and thereafter, activation annealing as a high-temperature thermal treatment is performed in an atmosphere in which AlN does not decompose and no pits are formed, or an atmosphere in which decomposition and growth of AlN are substantially balanced, i.e. an AlN growth atmosphere; as a result, it becomes possible to suppress degradation of the cap layer 2a itself, and hence a surface protective effect towards the n-GaN layer 12 can be preserved also during activation annealing, where the thermal treatment temperature is high, while suppressing nitrogen loss from the n-GaN layer 12. Therefore, activation annealing can be performed stably and effectively in the production of the semiconductor device, while further enhancing the operating characteristics of the semiconductor device that is produced.

Embodiment 2

Figure 3:
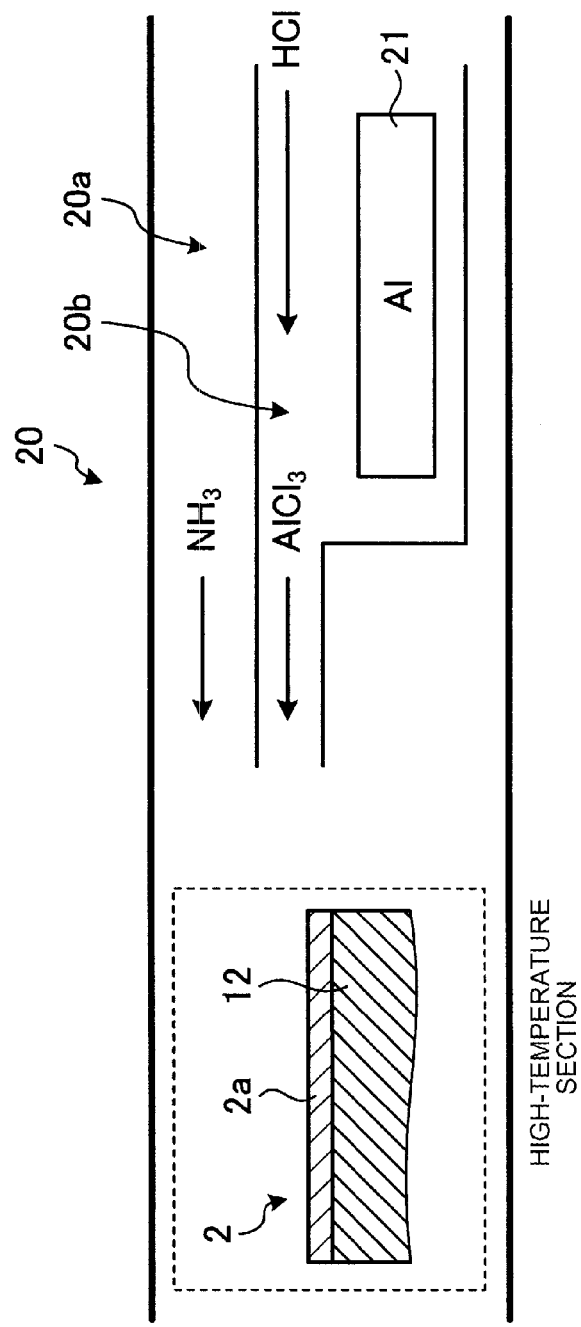
FIG. 3 is a schematic diagram for explaining a thermal treatment step in a method for producing a semiconductor device according to Embodiment 2 of the present invention.

A method for producing a semiconductor device according to Embodiment 2 of the present invention will be explained next. FIG. 3 is a schematic diagram for explaining a thermal treatment step in the method for producing a semiconductor device according to Embodiment 2.

Embodiment 2 differs from Embodiment 1 in that the substrate to be processed 2, having the cap layer 2a formed thereon, is subjected to activation annealing, as a high-temperature thermal treatment, in an AlN growth atmosphere based on hydride vapor phase epitaxy (HVPE). Specifically, as illustrated in FIG. 3, activation annealing is performed (high-temperature section inside the dotted line in FIG. 3), by placing the substrate to be processed 2 inside an HVPE apparatus 20 that has a first flow channel 20a and a second flow channel 20b on which an aluminum source 21 is placed, and by heating the substrate to be processed 2.

In the HVPE apparatus 20, specifically, for instance hydrogen chloride (HCl) gas is supplied to the second flow channel 20b in which the aluminum source 21 is placed. Aluminum chloride (AlCl$_3$), being a chloride of aluminum, is formed as a result, and is supplied to the substrate to be processed 2 that is disposed further downstream. Meanwhile, for instance ammonia (NH$_3$) gas, as a gas comprising hydrogen and nitrogen, is supplied to the substrate to be processed 2 via the first flow channel 20a. As a result, the substrate to be processed 2 becomes exposed, inside the HVPE apparatus 20, to an AlN growth atmosphere comprising a mixed gas of aluminum chloride and ammonia gas, i.e. a so-called vapor phase growth atmosphere (HVPE atmosphere). In the AlN growth atmosphere, the substrate to be processed 2 is subjected to activation annealing through heating at a high temperature, for instance 800° C. or higher, preferably 1200° C. or higher, and more preferably 1500° C. or higher. The impurities with which the n-GaN layer 12 has been doped are activated as a result. Other features of the method for producing a semiconductor device and of the produced semiconductor device are identical to those of Embodiment 1, and will not be explained again.

The method for producing a semiconductor device according to Embodiment 2 of the present invention explained above allows obtaining the same effect as in Embodiment 1, by performing activation annealing of the substrate to be processed 2 that yields the semiconductor device in the AlN growth atmosphere that makes up the cap layer 2a. The method in Embodiment 2 can be realized using an inexpensive gas and a metallic Al starting material, without the need for utilizing a costly organometallic material.

Embodiment 3

Figure 4:
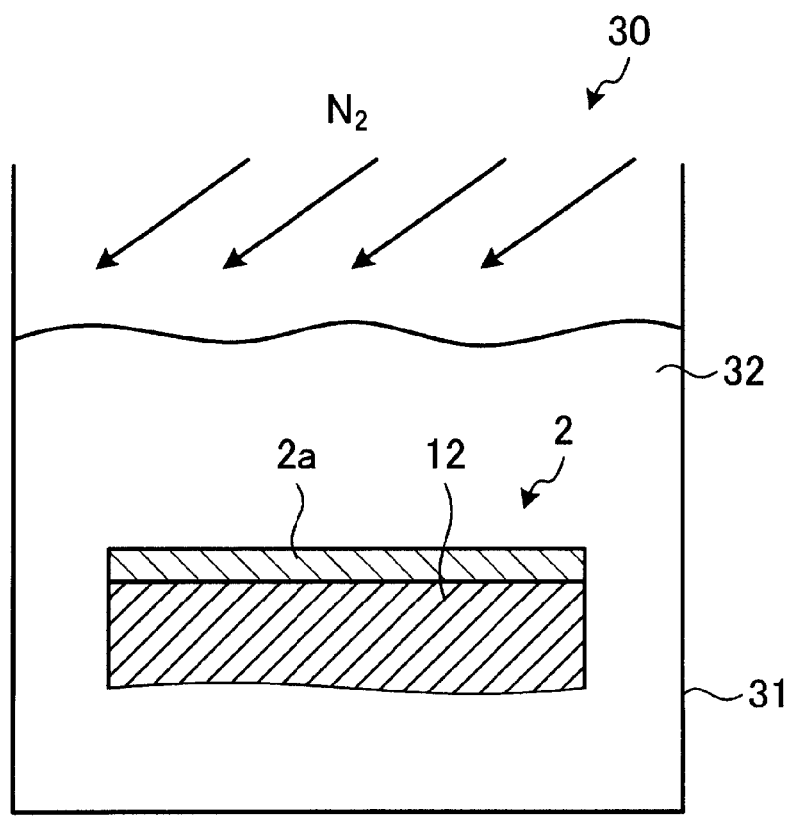
FIG. 4 is a schematic diagram for explaining a thermal treatment step in a method for producing a semiconductor device according to Embodiment 3 of the present invention.

A method for producing a semiconductor device according to Embodiment 3 of the present invention will be explained next. FIG. 4 is a schematic diagram for explaining a thermal treatment step in the method for producing a semiconductor device according to Embodiment 3.

Embodiment 3 differs from Embodiment 1 in that the substrate to be processed 2, having the cap layer 2a formed thereon, is subjected to activation annealing, as a high-temperature thermal treatment, in an AlN growth atmosphere based on of solution growth, which is a growth method via a melt using a crucible. Specifically, as illustrated in FIG. 4, the interior of a crucible 31 that stores a melt (Al melt) 32 comprising aluminum is configured such that nitrogen (N$_2$) gas can be supplied to the crucible 31, and activation annealing of the substrate to be processed 2 is performed using the solution growth apparatus 30 configured so that the substrate to be processed 2 can be immersed therein.

As used herein, the term solution growth denotes a method of growing AlN on a seed crystal of AlN, using a mixed melt comprising a melt of aluminum (Al) (Al melt 32), or a mixed melt comprising Al, and in addition, at least one from among an alkali metal, for instance lithium (Li), sodium (Na) or potassium (K), an alkaline earth metal such as magnesium (Mg), calcium (Ca), strontium (Sr), barium (Ba) or the like, or a metal such as tin (Sn), gallium (Ga), indium (In), copper (Cu) and bismuth (Bi), or various compounds of the foregoing. The pressure of nitrogen during growth of AlN is for instance 10 MPa or lower, preferably 1 MPa or lower, and the heating temperature ranges for instance from 600° C. to 2000° C. As a result, nitrogen dissolves from the vapor phase into the Al melt 32, and reacts therein with Al, whereupon a crystal of AlN, being a nitride of Al, is grown as a result.

In Embodiment 3, the Al melt 32 is stored in the crucible 31, as a growth vessel, and the crucible 31 is heated, for instance by a heater or the like, while $N_2$ gas is being supplied into the crucible 31. Meanwhile, at least the cap layer 2a of the substrate to be processed 2 is immersed in the Al melt 32 inside the crucible 31. The heating temperature of the Al melt 32 at this time is set to range for instance from 1200° C. to 2000° C. The AlN crystal that makes up the cap layer 2a of the substrate to be processed 2 becomes a seed crystal as a result, and the substrate to be processed 2 is subjected to a high-temperature thermal treatment while the cap layer 2a is exposed to the AlN growth atmosphere i.e. the solution growth atmosphere. As a result of this high-temperature thermal treatment, the substrate to be processed 2 undergoes activation annealing at a high temperature, for instance of 800° C. or higher, in the AlN growth atmosphere. The impurities with which the n-GaN layer 12 of the substrate to be processed has been doped become activated as a result. Other features of the method for producing a semiconductor device and of the produced semiconductor device are identical to those of Embodiment 1, and will not be explained again.

The method for producing a semiconductor device according to Embodiment 3 of the present invention explained above allows obtaining the same effect as in Embodiment 1, by performing activation annealing of the substrate to be processed 2 that yields the semiconductor device in the AlN growth atmosphere that makes up the cap layer 2a. In Embodiment 3, there is no need for using a gas that requires an abatement facility. Therefore, this allows equipment to be simplified and the process to be realized safely.

Embodiment 4

Figure 5:
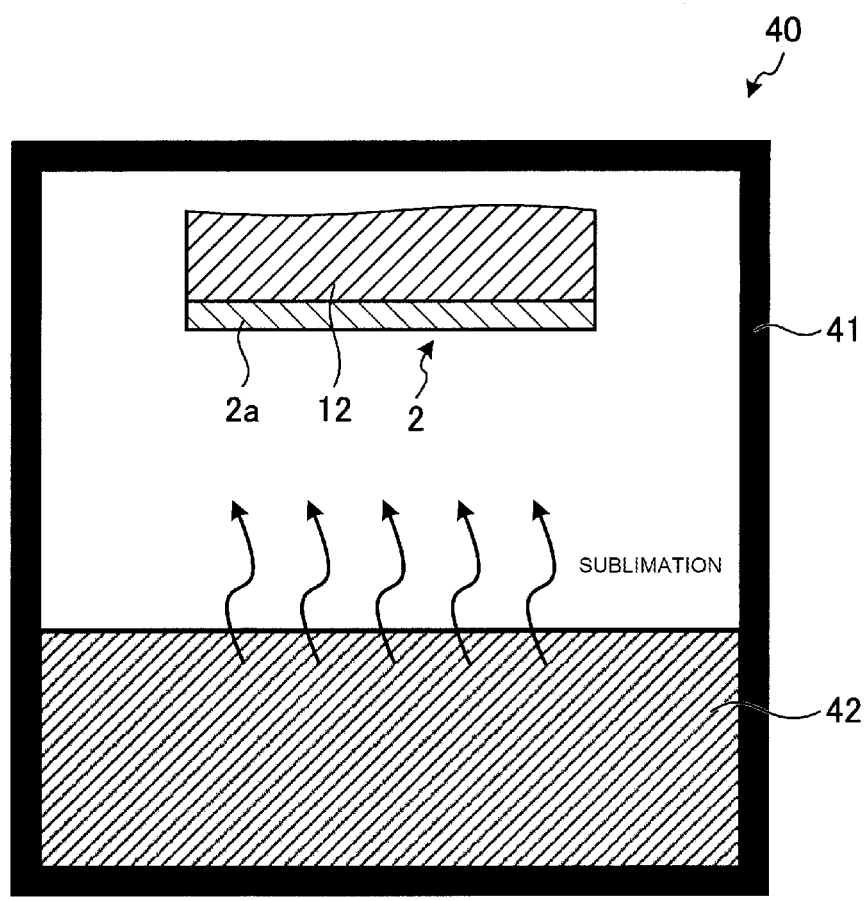
FIG. 5 is a schematic diagram for explaining a thermal treatment step in a method for producing a semiconductor device according to Embodiment 4 of the present invention.

A method for producing a semiconductor device according to Embodiment 4 of the present invention will be explained next. FIG. 5 is a schematic diagram for explaining a thermal treatment step in the method for producing a semiconductor device according to Embodiment 4.

Embodiment 4 differs from Embodiment 1 in that the substrate to be processed 2, having the cap layer 2a formed thereon, is subjected to activation annealing, as a high-temperature thermal treatment, in an AlN growth atmosphere based on of a sublimation in which a crucible is utilized.

Specifically, as illustrated in FIG. 5, a sublimation apparatus 40 is used that is configured in such a manner that the substrate to be processed 2, having the cap layer 2a formed thereon, can be set in the sublimation apparatus 40, within a crucible 41 that stores a powder (AlN powder) 42 of aluminum nitride. The substrate to be processed 2 is subjected to activation annealing using the sublimation apparatus 40.

Specifically, the crucible 41 is heated, for instance, through high-frequency induction heating, in a state where the AlN powder 42 is stored in the crucible 41 as a growth vessel. The heating temperature at the storage position of the AlN powder 42 is a high temperature, set to range for instance from 1900° C. to 2250° C. As a result, the AlN powder 42 undergoes sublimation decomposition according to Formula (1) below:

$$2AlN(s) \rightarrow 2Al(g)+N_2(g) \tag{1}$$

Meanwhile, the substrate to be processed 2 is disposed inside the crucible 41, at a position of a high-temperature region that is lower, for instance by about 100° C. to 500° C., than the temperature at the storage position of the AlN powder 42, specifically, for instance, a temperature in the range from 1400° C. to 2000° C. As a result, the substrate to be processed 2 undergoes activation annealing, as a high-temperature thermal treatment, in the AlN growth atmosphere that allows re-precipitation of AlN according to formula (2) below. The pressure of the $N_2$ gas in the AlN growth atmosphere is set to range for instance from 10 kPa to 100 kPa:

$$2Al(g)+N_2(g) \rightarrow 2AlN(s) \tag{2}$$

The substrate to be processed 2 becomes subjected as a result to activation annealing, as a high-temperature thermal treatment for instance at 800° C. or above, in the AlN growth atmosphere, whereupon the impurities with which the n-GaN layer 12 has been doped are activated. Other features of the method for producing a semiconductor device and of the produced semiconductor device are identical to those of Embodiment 1, and will not be explained again.

The method for producing a semiconductor device according to Embodiment 4 explained above allows obtaining the same effect as in Embodiment 1, by performing activation annealing of the substrate to be processed 2 that yields the semiconductor device in the AlN growth atmosphere that makes up the cap layer 2a. In Embodiment 4, there is no need for using a gas that requires an abatement facility. Therefore, this allows equipment to be simplified and the process to be realized safely. Further, only AlN and a nitrogen starting material are used herein, and hence there is no concern of impurity contamination.

Embodiment 5

Figure 6:
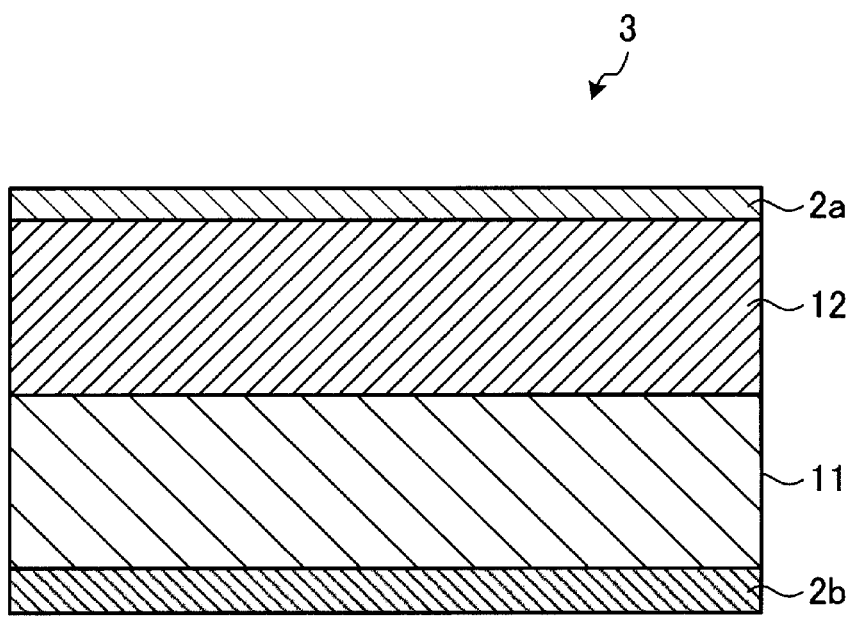
FIG. 6 is a cross-sectional diagram of a substrate to be processed for explaining a thermal treatment step in a method for producing a semiconductor device according to Embodiment 5 of the present invention.

A method for producing a semiconductor device according to Embodiment 5 of the present invention will be explained next. FIG. 6 is a cross-sectional diagram illustrating a substrate to be processed 3 subjected to a thermal treatment according to Embodiment 5.

Embodiment 5 differs from Embodiment 1 to Embodiment 4 in that, after formation of the cap layer 2a on the surface of the n-GaN layer 12, a cap layer 2b comprising AlN, as a rear surface protective film, is formed, for instance by MOCVD, on the rear surface of the n-GaN substrate 11, on the side opposite that of the stacking face on which the n-GaN layer 12 is formed. Specifically, the substrate to be processed 3 is formed in which cap layers 2a, 2b, as protective films, are respectively formed on the surface of the n-GaN layer 12 and on the rear surface of the n-GaN substrate 11. The cap layers 2a, 2b can be formed simultaneously. Thereafter, the substrate to be processed 3 is subjected to activation annealing in the AlN growth atmosphere according to Embodiment 1 to Embodiment 4, as a result of which the impurities with which the n-GaN layer 12 has been doped become activated. Other features of the method for producing a semiconductor device and of the produced semiconductor device are identical to those of Embodiment 1 to Embodiment 4, and will not be explained again.

In the method for producing a semiconductor device according to Embodiment 5 explained above, activation annealing is performed in accordance with the same methods as in Embodiment 1 to Embodiment 4, and hence the same effect as in Embodiment 1 to Embodiment 4 can be achieved herein. Further, activation annealing is performed in a state where the cap layer 2b is formed on the rear surface of the n-GaN substrate 11. As a result, this allows activating the impurities while suppressing occurrence of nitrogen loss from the n-GaN substrate 11 due to the high-temperature thermal treatment. It becomes therefore possible to further enhance the characteristics of the semiconductor device that is produced using the substrate to be processed 3.

Embodiment 6

A method for producing a semiconductor device according to Embodiment 6 of the present invention will be explained next. In the method for producing a semiconductor device according to Embodiment 6, the heating temperature in activation annealing is repeatedly raised and lowered.

Specifically, during the high-temperature thermal treatment of the substrate to be processed 2 in the AlN growth atmosphere according to Embodiment 1 to Embodiment 5, the heating temperature is for instance raised from 1000° C. up to for instance 1400° C., and after a predetermined time has elapsed, the temperature is lowered for instance from 1400° C. down to for instance 1000° C. The substrate to be processed 2 is thus subjected to activation annealing by performing a so-called multi-cycle thermal treatment in which the above cycle from temperature raising up to temperature lowering is repeated over a plurality of cycles of raising and lowering the heating temperature.

Herein, B. N. Feigelson et Al., "Multicycle rapid thermal annealing technique and its application for the electrical activation of Mg implanted in GaN" Journal of Crystal Growth 350 (2012), pp. 21-26 (Non-patent literature 4), discloses a multi-cycle thermal treatment in which there is repeated a plurality of cycles of a rapid thermal treatment (RTA: Rapid Thermal Annealing) after doping of GaN with magnesium (Mg), wherein each cycle involves raising the heating temperature from about 1000° C. up to 1400° C., and lowering thereafter the temperature down to about 1000° C. once more, in an atmosphere at a pressure of 2 MPa. After the heating temperature has been raised up to about 1400° C. in Non-patent literature 4, however, the heating temperature is lowered down to about 1000° C., before pits are formed on the surface of the GaN layer doped with Mg, to suppress thereby formation of pits. Each cycle ($\Delta T$) from raising to lowering of the heating temperature took thus a very short time, of 8.4 seconds.

In Embodiment 6, by contrast, a multi-cycle thermal treatment is performed that involves lowering the heating temperature once a predetermined time has elapsed after raising of the heating temperature, in the high-temperature thermal treatment in the AlN growth atmosphere according to Embodiment 1 to Embodiment 5 described above. As a result, it becomes possible to significantly suppress formation of pits in the cap layer 2a of the substrate to be processed 2, and therefore each cycle from raising to lowering of the heating temperature can be prolonged, and a thermal treatment can thus be performed in an atmosphere at a lower pressure or a higher temperature. In turn, this allows subjecting the substrate to be processed 2 to a stable high-temperature thermal treatment more efficiently than in the related art disclosed in Non-patent literature 4, and a semiconductor device can thus be produced that has more stable characteristics.

Embodiments of the present invention have been explained in specific terms above, but the present invention is not limited to the embodiments described above, and may accommodate all manner of variations that are based on the technical concept of the present invention. For instance, the numerical values in the embodiments above are merely exemplary in character, and other numerical values may be resorted to, as needed.

In the embodiments described above, for instance, the n-GaN layer 12 is doped with impurities by ion implantation, but the impurity doping method is not necessarily limited to ion implantation, and other impurity doping methods may be resorted to that involve, for instance, introducing impurities into the growth atmosphere during epitaxial growth of the n-GaN layer 12.

In the embodiments described above, instances have been explained in which the high-temperature thermal treatment according to the present invention is used in the activation annealing that is performed after impurity doping, specifically activation annealing for activating the impurities with which the GaN layer has been doped, but the thermal treatment is not necessarily limited to activation annealing, and the thermal treatment of the present invention may be used in any other instances of thermal treatment that is performed on semiconductor layers, for example annealing after formation of a gate oxide film (Post-Deposition Anneal: PDA), or in metal-sinter treatments.

In the embodiments explained above, an instance of a vertical-type MOSFET has been explained, but the semiconductor device is not necessarily limited to a vertical-type MOSFET, and may be some other semiconductor device, of various kinds, for instance a transistor, diode, power source circuit inverter or the like, produced in accordance with a production method that has a thermal treatment step.

INDUSTRIAL APPLICABILITY

The present invention can be suitably used in cases where a thermal treatment step is involved in the production of a semiconductor device that utilizes a wide band gap semiconductor, for instance gallium nitride (GaN)-based semiconductor.

EXPLANATION OF REFERENCE NUMERALS 1 semiconductor device
2, 3 substrate to be processed
2a, 2b cap layer
11 n-GaN substrate
12 n-GaN layer
13 p-type well region
14 $p^+$-type well region
15 $n^+$-type source region
16 gate electrode
17 gate insulating film
18 source electrode
19 drain electrode
20 hydride vapor phase epitaxy apparatus (HVPE apparatus)
20a first flow channel
20b second flow channel
21 aluminum source
30 solution growth apparatus
31, 41 crucible
32 aluminum melt (Al melt)
40 sublimation apparatus
42 aluminum nitride powder (AlN powder)

What is claimed is:
1. A method for producing a semiconductor device having a nitride-based semiconductor layer, the method comprising the steps of:
providing a nitride-based semiconductor layer;
doping the nitride-based semiconductor layer with an impurity;

forming an aluminum nitride layer on a surface of the nitride-based semiconductor layer at a forming temperature and in a growth atmosphere for aluminum nitride; and performing a thermal treatment on the nitride-based semiconductor layer and the aluminum nitride layer at a treatment temperature that is effective for activation annealing of the nitride-based semiconductor layer and that is higher than a decomposition temperature for aluminum nitride, and in the growth atmosphere for aluminum nitride to form a new aluminum nitride layer on the aluminum nitride layer under conditions effective therefore, wherein the treatment temperature is 1400° C. or higher.

2. The method for producing a semiconductor device according to claim 1, wherein the aluminum nitride layer is a film having a polycrystalline structure or a film formed by epitaxial growth.

3. The method for producing a semiconductor device according to claim 2, wherein the growth atmosphere for aluminum nitride during the thermal treatment is an atmosphere in which growth and decomposition of aluminum nitride are substantially balanced.

4. The method for producing a semiconductor device according to claim 2, wherein the growth atmosphere of aluminum nitride during the thermal treatment is a metal-organic chemical vapor deposition atmosphere made up of a mixed gas atmosphere of an organometallic gas containing aluminum, and a gas that contains hydrogen and nitrogen.

5. The method for producing a semiconductor device according to claim 2, wherein the growth atmosphere of aluminum nitride during the thermal treatment is a vapor phase growth atmosphere made up of a mixed gas atmosphere of a chloride gas containing aluminum, and a gas containing hydrogen and nitrogen.

6. The method for producing a semiconductor device according to claim 2, wherein the growth atmosphere of aluminum nitride during the thermal treatment is a solution growth atmosphere that comprises a melt containing aluminum, and a nitrogen-containing gas.

7. The method for producing a semiconductor device according to claim 2, wherein the growth atmosphere of aluminum nitride during the thermal treatment is a sublimation atmosphere that causes a powder of aluminum nitride to sublimate.

8. The method for producing a semiconductor device according to claim 3, wherein the growth atmosphere of aluminum nitride during the thermal treatment is a metal-organic chemical vapor deposition atmosphere made up of a mixed gas atmosphere of an organometallic gas containing aluminum, and a gas that contains hydrogen and nitrogen.

9. The method for producing a semiconductor device according to claim 3, wherein the growth atmosphere of aluminum nitride during the thermal treatment is a vapor phase growth atmosphere made up of a mixed gas atmosphere of a chloride gas containing aluminum, and a gas containing hydrogen and nitrogen.

10. The method for producing a semiconductor device according to claim 3, wherein the growth atmosphere of aluminum nitride during the thermal treatment is a solution growth atmosphere that comprises a melt containing aluminum, and a nitrogen-containing gas.

11. The method for producing a semiconductor device according to claim 3, wherein the growth atmosphere of aluminum nitride during the thermal treatment is a sublimation atmosphere that causes a powder of aluminum nitride to sublimate.

12. The method for producing a semiconductor device according to claim 1, wherein the growth atmosphere for aluminum nitride during the thermal treatment is an atmosphere in which growth and decomposition of aluminum nitride are substantially balanced.

13. The method for producing a semiconductor device according to claim 1, wherein the growth atmosphere of aluminum nitride during the thermal treatment is a metal-organic chemical vapor deposition atmosphere made up of a mixed gas atmosphere of an organometallic gas containing aluminum, and a gas that contains hydrogen and nitrogen.

14. The method for producing a semiconductor device according to claim 13, wherein the organometallic gas is trimethyl aluminum gas, and the gas containing hydrogen and nitrogen contains a mixed gas of ammonia gas and a gas that contains at least one of hydrogen gas and nitrogen gas.

15. The method for producing a semiconductor device according to claim 1, wherein the growth atmosphere of aluminum nitride during the thermal treatment is a vapor phase growth atmosphere made up of a mixed gas atmosphere of a chloride gas containing aluminum, and a gas containing hydrogen and nitrogen.

16. The method for producing a semiconductor device according to claim 1, wherein the growth atmosphere of aluminum nitride during the thermal treatment is a solution growth atmosphere that comprises a melt containing aluminum, and a nitrogen-containing gas.

17. The method for producing a semiconductor device according to claim 1, wherein the growth atmosphere of aluminum nitride during the thermal treatment is a sublimation atmosphere that causes a powder of aluminum nitride to sublimate.

18. The method for producing a semiconductor device according to claim 1, wherein the nitride-based semiconductor layer comprises gallium nitride.

19. A semiconductor device, which is produced by the method for producing a semiconductor device according to claim 1.

20. The method for producing a semiconductor device according to claim 1, wherein conditions effective to form said new aluminum nitride layer while performing the thermal treatment include at least one of the treatment temperature, atmosphere pressure, and supply amounts of the growth atmosphere.

21. The method for producing a semiconductor device according to claim 1, wherein the treatment temperature is 1500° C. or more.

22. The method for producing a semiconductor device according to claim 21, wherein the treatment temperature ranges from 1500° C. to 1700° C.

* * * * *